United States Patent [19]

Hart et al.

[11] Patent Number: 5,726,484
[45] Date of Patent: Mar. 10, 1998

[54] MULTILAYER AMORPHOUS SILICON ANTIFUSE

[75] Inventors: Michael J. Hart, Palo Alto; Kevin T. Look, Fremont; Yakov Karpovich, Campbell, all of Calif.

[73] Assignee: Xilinx, Inc., San Jose, Calif.

[21] Appl. No.: 611,897

[22] Filed: Mar. 6, 1996

[51] Int. Cl.⁶ .............. H01L 29/04; H01L 27/10; H01L 29/00
[52] U.S. Cl. .............. 257/530; 257/50; 257/52; 257/57; 257/209; 438/600
[58] Field of Search .............. 257/50, 52, 57, 257/530, 209; 438/600

[56] References Cited

U.S. PATENT DOCUMENTS

| Re. 34,363 | 8/1993 | Freeman | 307/465 |
|---|---|---|---|
| 4,706,216 | 11/1987 | Carter | 365/94 |
| 4,847,732 | 7/1989 | Stopper et al. | 257/530 |
| 4,870,302 | 9/1989 | Freeman | 307/465 |
| 5,070,384 | 12/1991 | McCollum et al. | 357/51 |
| 5,181,096 | 1/1993 | Forouhi | 257/530 |
| 5,367,207 | 11/1994 | Goetting et al. | 307/465 |
| 5,373,169 | 12/1994 | McCollum et al. | 257/530 |
| 5,475,253 | 12/1995 | Look et al. | 257/530 |
| 5,552,627 | 9/1996 | McCollum et al. | 257/530 |

FOREIGN PATENT DOCUMENTS

| 0 416 903 A2 | 3/1991 | European Pat. Off. . |
|---|---|---|
| 0 452 091 A2 | 10/1991 | European Pat. Off. . |
| 0 483 958 A1 | 5/1992 | European Pat. Off. . |
| 0 500 034 A1 | 8/1992 | European Pat. Off. . |
| 3927033 A1 | 1/1990 | Germany . |
| WO 92/16976 | 10/1992 | WIPO . |
| WO 92/20095 | 11/1992 | WIPO . |

OTHER PUBLICATIONS

"The Programmable Logic Data Book", pp. 1-3 to 1-8 and 2-105 to 2-117, copyright 1994, Xilinx, Inc., 2100 Logic Drive, San Jose, CA 95124.

Kueing-Long Chen, David K. Y. Liu, George Misium, W. Milton Gosney, Shoue-Jen Wang, Janet Camp, and Howard Tigelaar, "A Sublithographic Antifuse Structure for Field-Programmable Gate Array Applications", © 1992 IEEE, IEEE Electron Device Letters, vol. 13, No. 1, pp. 53-55, Jan. 1992.

Brian Cook, Steve Keller, "Amorphous Silicon Antifuse Technology for Bipolar PROMs", 1986 Bipolar Circuits and Technology Meeting—© 1986 IEEE, pp. 99-100.

Steve Chiang, Rahim Forouhi, Wenn Chen, Frank Hawley, John McCollum, Esmat Hamdy, And Chenming Hu, "Antifuse Structure Comparison for Field Programmable Gate Arrays", IEDM IEEE Apr. 1992, pp. 24.6.1–24.6.4, no month.

Stanley Wolf, Richard N. Tauber, "Silicon Processing for the VLSI Era", vol. 1: Process Technology, p. 398, © 1985 IEEE, Lattice Press Sunset Beach, California, no month.

*Primary Examiner*—Valencia Martin Wallace
*Attorney, Agent, or Firm*—David J. Weitz; Jeanette S. Harms

[57] ABSTRACT

Antifuses are provided which include first and second conductive layers and an antifuse layer positioned between the first and second conductive layers. The antifuse layer includes at least one oxide layer positioned between two amorphous silicon layers. Interconnect structures and programmable logic devices are also provided which include the antifuses.

30 Claims, 14 Drawing Sheets

| Conductive Layer 101 |
| Amorphous Silicon Layer 203 |
| Oxide Layer 202 |
| Amorphous Silicon Layer 201 |
| Conductive Layer 102 |
| Substrate 103 |

} 105 Antifuse Layer

| Conductive Layer 101 |
| Amorphous Silicon Layer 305 |
| Oxide Layer 304 |
| Amorphous Silicon Layer 303 |
| Oxide Layer 302 |
| Amorphous Silicon Layer 401 |
| Conductive Layer 102 |
| Substrate 103 |

} 105 Antifuse Layer

Figure 2

| Conductive Layer 101 |
|---|
| Amorphous Silicon Layer 203 |
| Oxide Layer 202 |
| Amorphous Silicon Layer 201 |
| Conductive Layer 102 |
| Substrate 103 |

} 105 Antifuse Layer (layers 201–203)

Figure 3

| Conductive Layer 101 |
|---|
| Amorphous Silicon Layer 305 |
| Oxide Layer 304 |
| Amorphous Silicon Layer 303 |
| Oxide Layer 302 |
| Amorphous Silicon Layer 401 |
| Conductive Layer 102 |
| Substrate 103 |

} 105 Antifuse Layer (layers 302–305)

MULTILAYER AMORPHOUS SILICON ANTIFUSE

BACKGROUND OF THE INVENTION

1. Field of the Invention

The present invention relates to antifuses for use in programable logic devices. More particularly, the present invention relates to amorphous silicon antifuses having at least one oxide layer.

2. Description of Related Art

Programmable logic devices such as field programmable gate arrays generally include a plurality of programable logic blocks and a programable interconnect structure for interconnecting the logic blocks. In one implementation, shortable elements, called antifuses, are incorporated into the programmable interconnect structure to form programmable connections between the logic blocks.

Antifuses are programable elements which before programming have a high impedance and which upon the application of a sufficient voltage, referred to herein as a programming voltage, change to a low impedance conductive state. Antifuses are generally formed of two conductive layers which serve as electrical terminals and which are separated by an antifuse layer whose resistance is changed by the application of the programing voltage across the terminals. As used herein, an unprogrammed antifuse refers to an antifuse in a high impedance state and a programmed antifuse refers to an antifuse which has been exposed to a programming voltage to reduce the impedance of the antifuse.

Antifuses may be generally divided into two categories, dielectric and amorphous silicon antifuses. Dielectric antifuses generally consist of at least one dielectric layer positioned between two conductive layers, most commonly N+ diffusion and polysilicon. Upon the application of a programming voltage, the dielectric is broken down such that the antifuse becomes conductive. Chiang, et al., "Antifuse Structure Comparison for Field Programmable Gate Arrays" *IEDM IEEE* pp. 611–614 (1992) discuss a number of dielectric antifuse structures.

Amorphous silicon antifuses generally consist of an antifuse layer formed of amorphous silicon (a-Si, $Si_xH_yN_z$) positioned between two conductive layers, most commonly two metal layers. When a programming voltage is passed through the amorphous silicon layer, the amorphous silicon undergoes a phase change to a lower impedance state. U.S. Pat. No. 5,181,096 to Forouhi discloses an antifuse in which the dielectric layer includes an amorphous silicon (a-Si) layer positioned between two dielectric films. The dielectric films are formed by either a low pressure chemical vapor deposition (LPCVD) or plasma enhanced CVD (PECVD).

Several performance characteristics are used to evaluate the performance of an antifuse and its usefulness as a programmable element in a programmable interconnect structure. These performance characteristics include leakage current, programming voltage, post programming resistance, time dependent dielectric breakdown and defect failure lifetime.

Leakage current refers to the amount of current which passes through an antifuse in its unprogrammed state at a given voltage. The leakage current of a particular antifuse can vary with temperature. Since the leakage current can cause errors in data transmission, it is preferred that the leakage current of an unprogrammed antifuse be as low as possible. The leakage current of an antifuse is dependent on the quality of the antifuse layer as well as the thickness of the antifuse layer. For example, leakage current can be reduced by increasing the antifuse layer's thickness. However, the programming voltage of the antifuse increases as the antifuse layer's thickness increases.

The programing voltage of an antifuse must be higher than the operating voltage (Vcc) of the programmable logic device so that the antifuse is not programmed during the normal operation of the device. As lower operating voltages are used, the need for antifuses which can operate at lower programming voltages will increase. Since the amount of voltage needed to program an antifuse depends on the thickness of the antifuse layer used, a need exists for antifuses having thinner antifuse layers.

Prior to the antifuse being programmed, the antifuse acts as an off device since the antifuse prevents current from passing through the antifuse. After programing, the antifuse forms a linkage through which electrical signals are conveyed. In order for the device to operate at high speeds, the resistance of the antifuse after programing should be as low as possible. Antifuses having a low resistance after being programmed have been found to be more reliable than antifuses having a higher programmed resistance. Although the mechanism for device failure is not well understood, the heat generated within the device due to the resistance of the programmed antifuse is believed to contribute to device failure. The resistance of the programmed antifuse is generally proportional to the thickness of the antifuse layer used in the antifuse structure. It is therefore preferred that the antifuse layer be as thin as possible.

The time dependent dielectric breakdown (TDDB) of an antifuse refers to breakdown of the antifuse over time due to the antifuse being exposed to the operating voltage (Vcc). Since the TDDB of an antifuse is directly related to the long term reliability of the antifuse, it is preferred that the TDDB of the antifuse be as long as possible.

The defect failure lifetime of an antifuse relates to the time dependent frequency with which antifuses have or develop defects which cause unprogrammed antifuses to be conductive. Since the defect failure lifetime of an antifuse is directly related to the long term reliability of the antifuse, it is preferred that the defect failure lifetime of the antifuse be as long as possible.

As discussed above, increasing the thickness of the antifuse layer advantageously reduces the leakage current of the antifuse and reduces the frequency of antifuse breakdown due to defects in the dielectric layer or the application of a voltage across the antifuse. However, increasing the thickness of the antifuse layer has the undesirable effects of increasing the programing voltage of the antifuse as well as the resistance of the programmed antifuse layer.

A need therefore exists for an antifuse having a thin antifuse layer which provides the combined advantages of having a low current leakage and a low frequency of antifuse breakdown due to defects in the dielectric layer or the application of a voltage across the antifuse, while providing a low programing voltage and a low resistance once programed.

SUMMARY OF THE INVENTION

The present invention relates to an amorphous silicon antifuse which includes at least one oxide layer positioned between two amorphous silicon layers. In one embodiment, at least two different oxide layers are positioned between two amorphous silicon layers. In another embodiment, the oxide layer is grown from the amorphous silicon layer. The present invention also relates to an interconnect structure and a programable logic device which includes one or more antifuses according to the present invention.

The mutilayer structure of the amorphous silicon antifuses of the present invention enable thin antifuse layers to be used while still providing desirable performance characteristics. In particular, the antifuses of the present invention provide enhanced programing voltage characteristics and reduced low voltage failure.

In one embodiment, the antifuse layer has a thickness of less than about 100 nm, in another embodiment less than about 85 nm. The thickness of the antifuse layer in one embodiment is between about 20 and 85 nm. In another embodiment, the antifuse layer has a thickness of between about 50 and 85 nm.

In one embodiment, the oxide layer(s) are each less than about 10 nm thick, in another embodiment between about 1 and 10 nm thick. By limiting the thickness of the oxide layer, the amorphous silicon nature of the antifuse is maintained.

In one embodiment, the one or more oxide layers are grown using a high dose Ar+ implant or using an oxygen plasma. In another embodiment, the one or more oxide layers are self-limiting oxide layers.

In one embodiment, the amorphous silicon layer $(Si_xH_yN_z)$ used in the antifuse layer is formed of between about 8–12% H and between about 10–25% N (in mole percentages). In another embodiment, the amorphous silicon layer includes about 20% N.

According to the present invention, a plurality of antifuses are incorporated into an interconnect structure which, in turn, is incorporated into a programable logic device. In such cases, the plurality of antifuses in the interconnect structure or programable logic device are programmed over a range of programming voltages. In one embodiment, the range of programming voltages form a distribution which has a standard deviation of less than about 0.30. In another embodiment, the range of programing voltages form a distribution which has a standard deviation of less than about 0.25. In yet another embodiment, the standard deviation is less than about 0.20.

BRIEF DESCRIPTION THE FIGURES

FIGS. 1A–G illustrate antifuse structures according to the present invention.

FIG. 2 illustrates a cross-section of an antifuse layer which includes an oxide layer positioned between two layers of amorphous silicon.

FIG. 3 illustrates a cross-section of an antifuse layer which includes two oxide layers which are each positioned between amorphous silicon layers.

Figure 4:
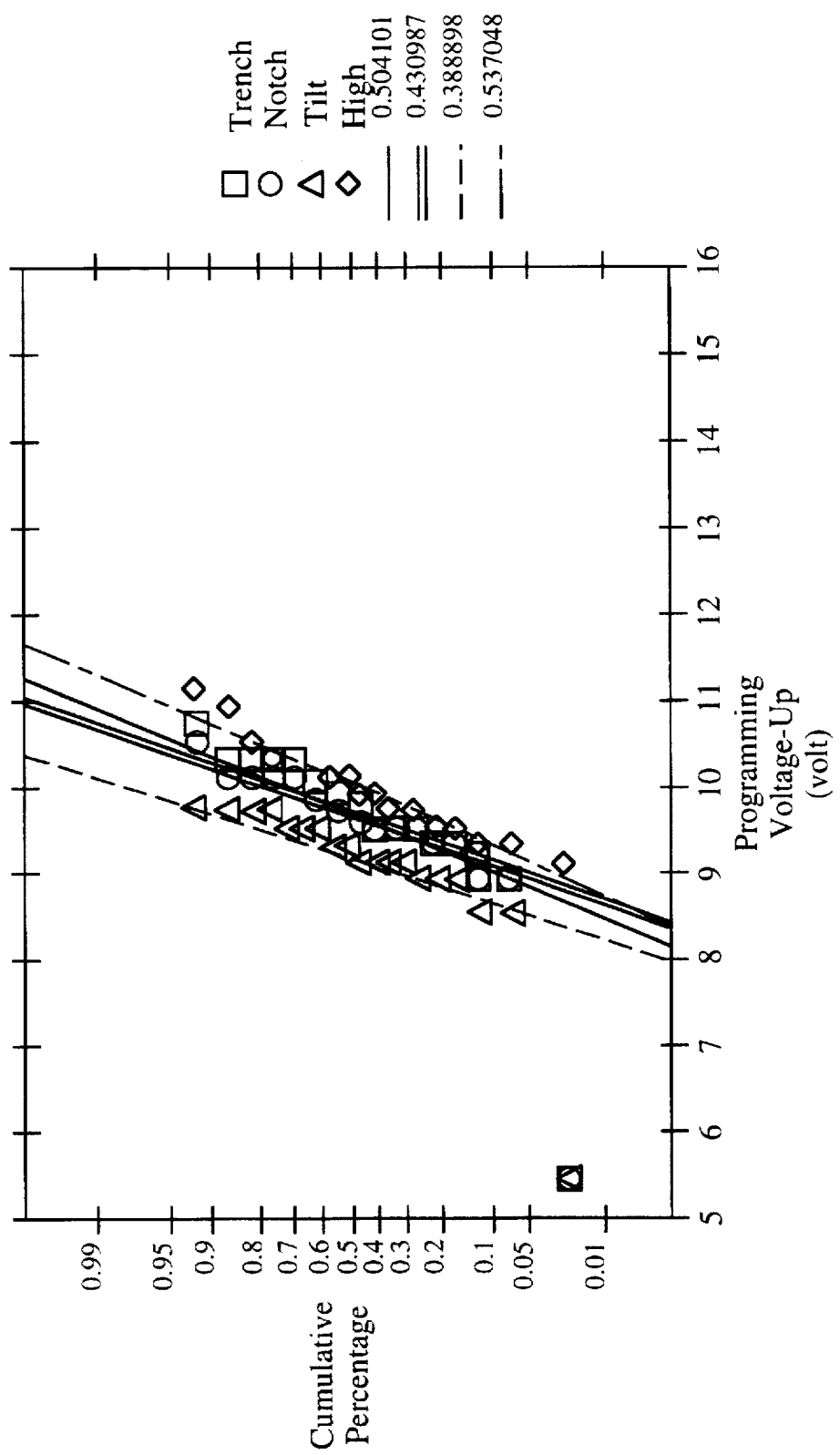

FIG. 4 graphs the programming voltage characteristics of the antifuse structure having an amorphous silicon layer and an oxide layer.

Figure 5:
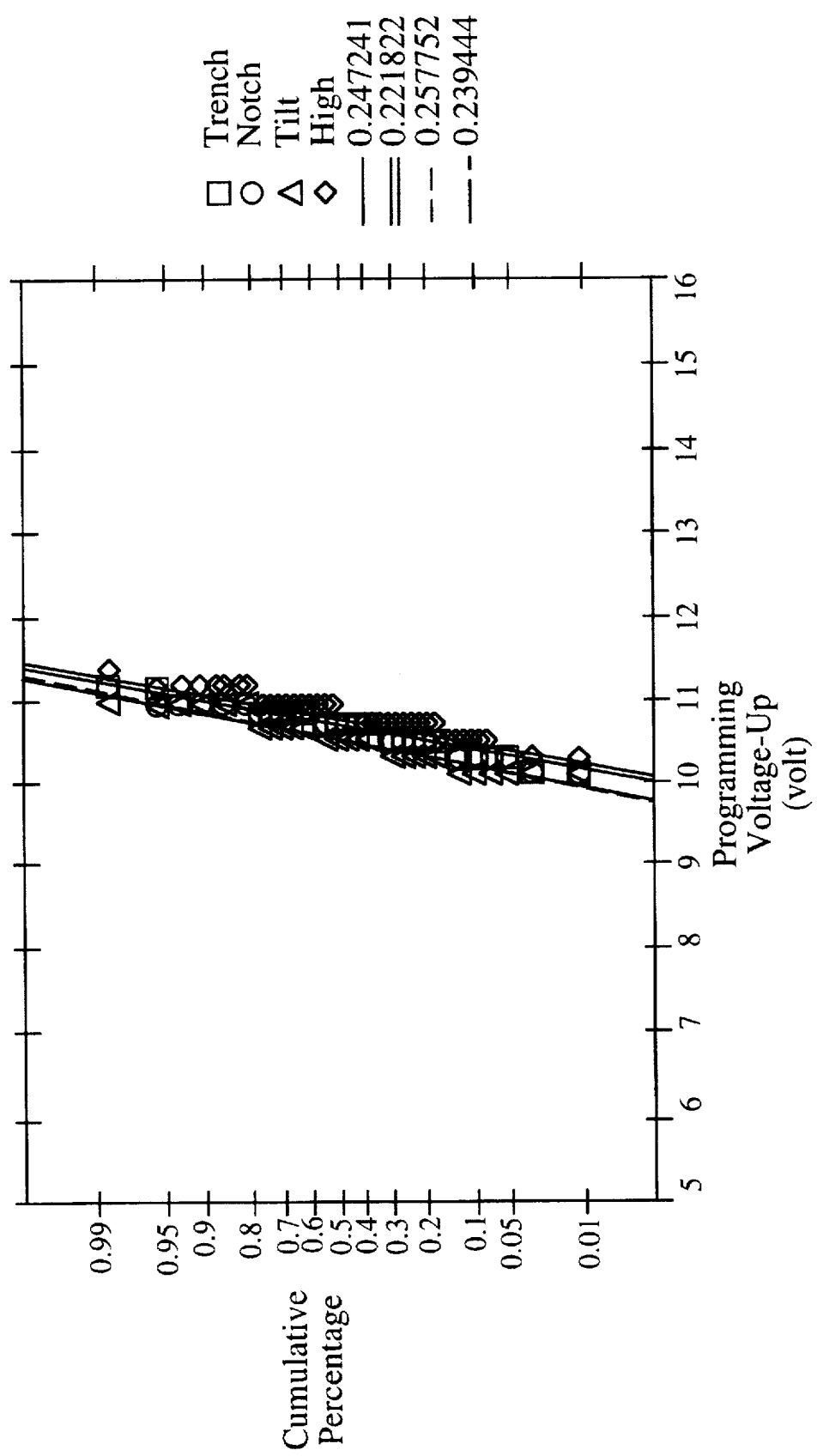

FIG. 5 graphs the programming voltage characteristics of the antifuse structure illustrated in FIG. 2.

Figure 6:
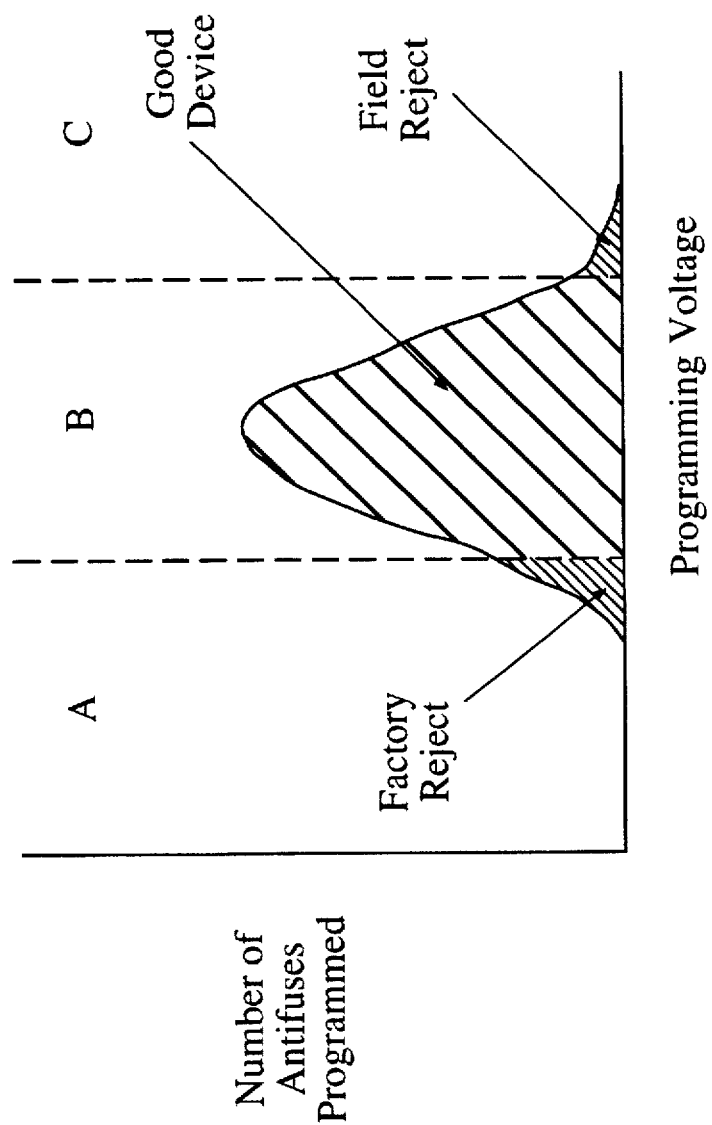

FIG. 6 illustrates a distribution of devices containing antifuses by programming voltage.

Figure 7:
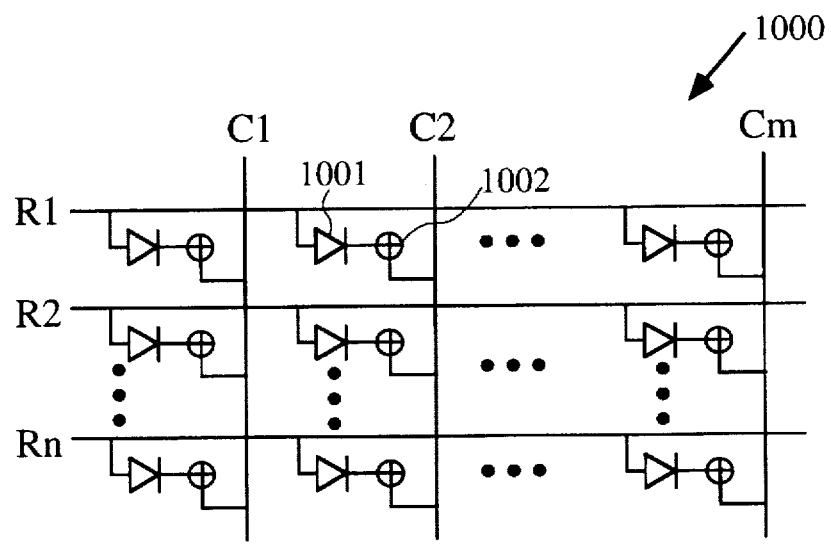

FIG. 7 illustrates an interconnect structure which includes a plurality of antifuses according to the present invention.

Figure 8:
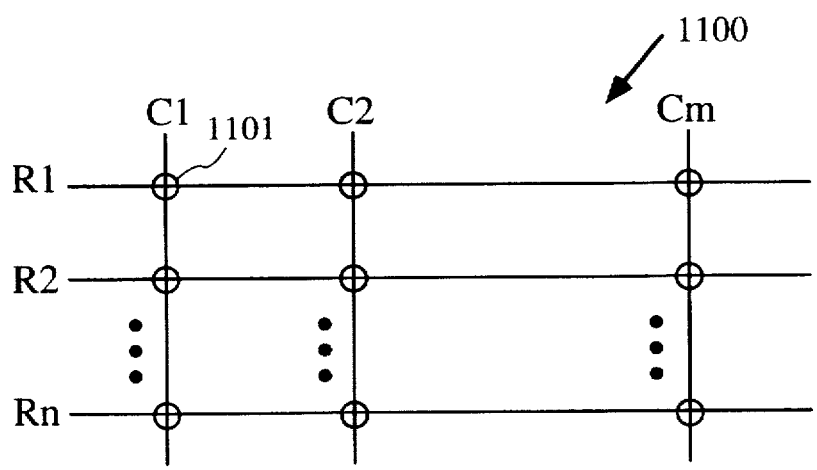

FIG. 8 illustrates an alternate interconnect structure which includes a plurality of antifuses according to the present invention.

Figure 9:
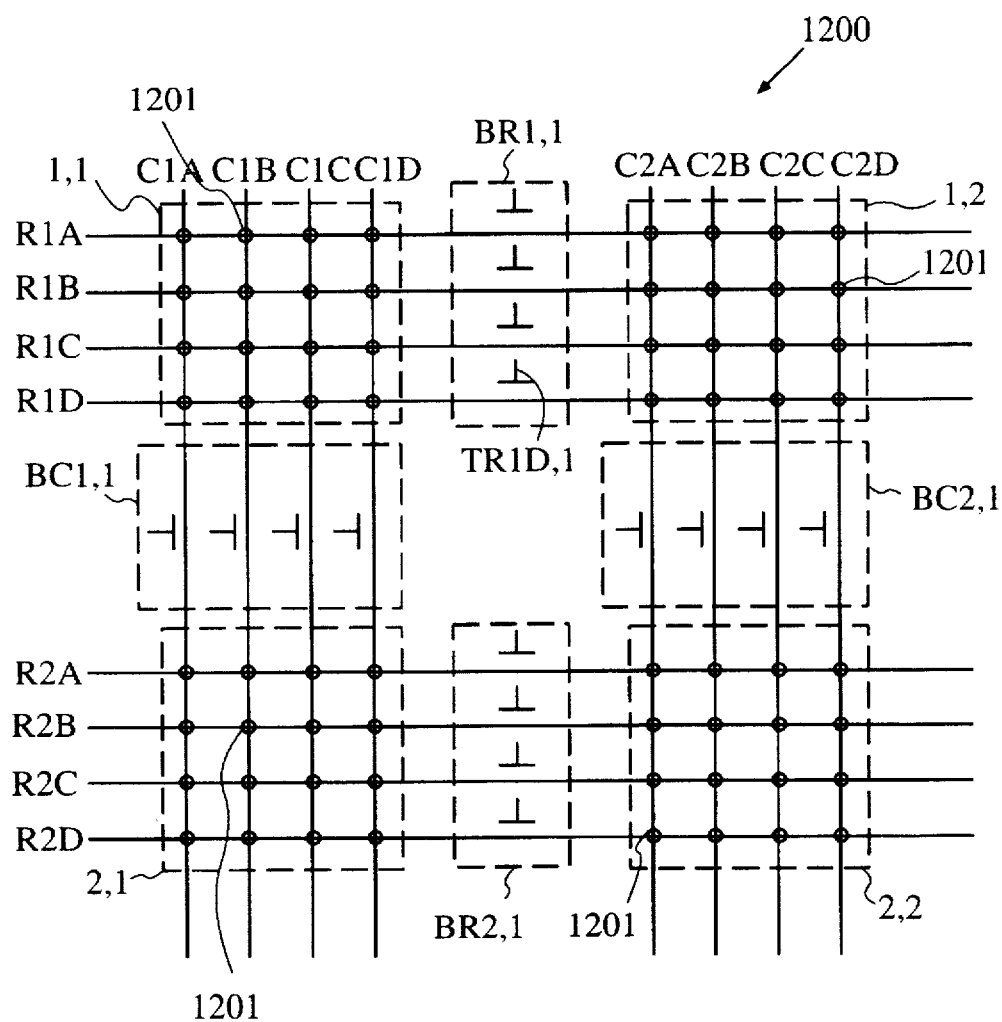

FIG. 9 illustrates an alternate interconnect structure which includes a plurality of antifuses according to the present invention.

Figure 10A:
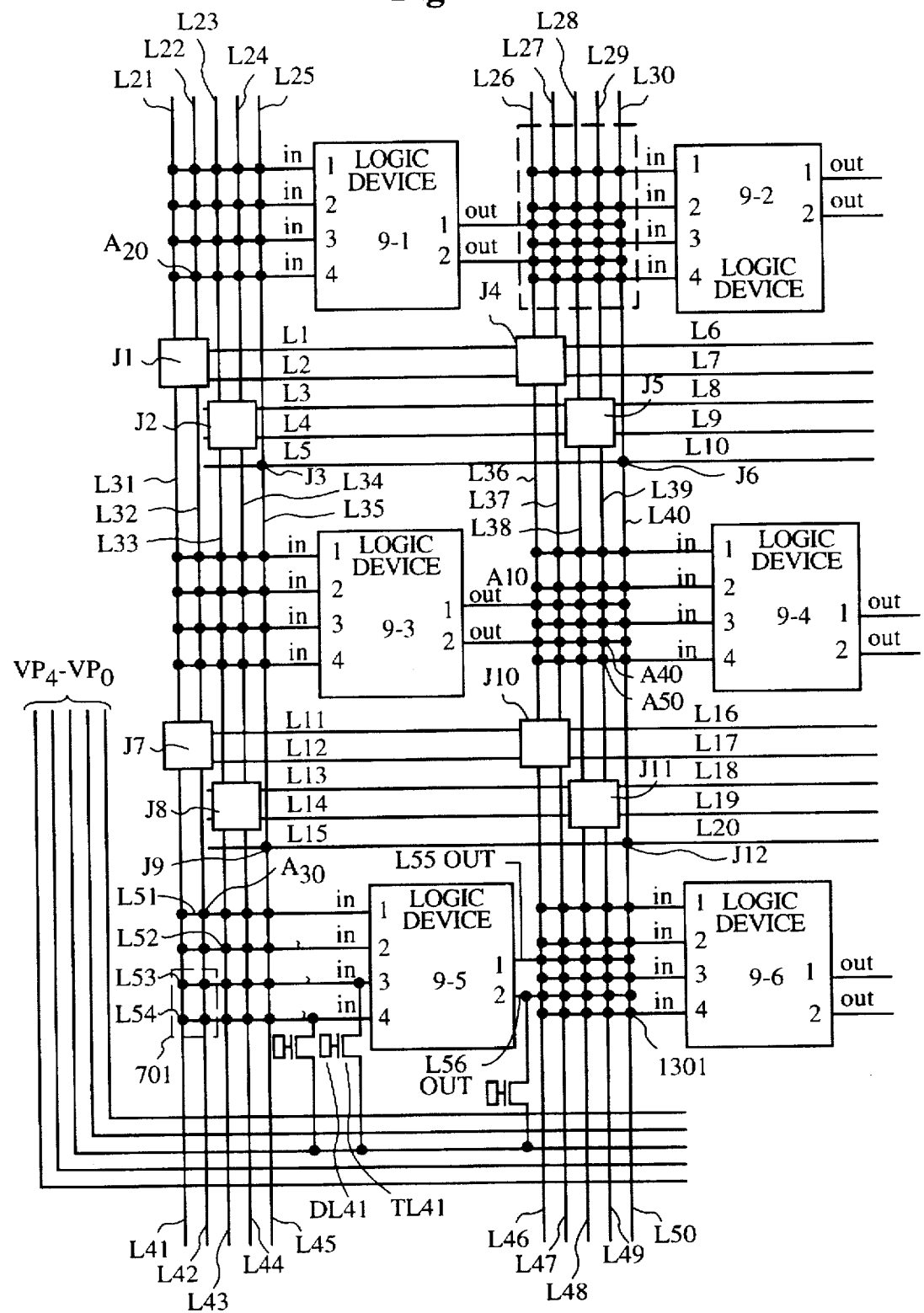
Figure 10B:
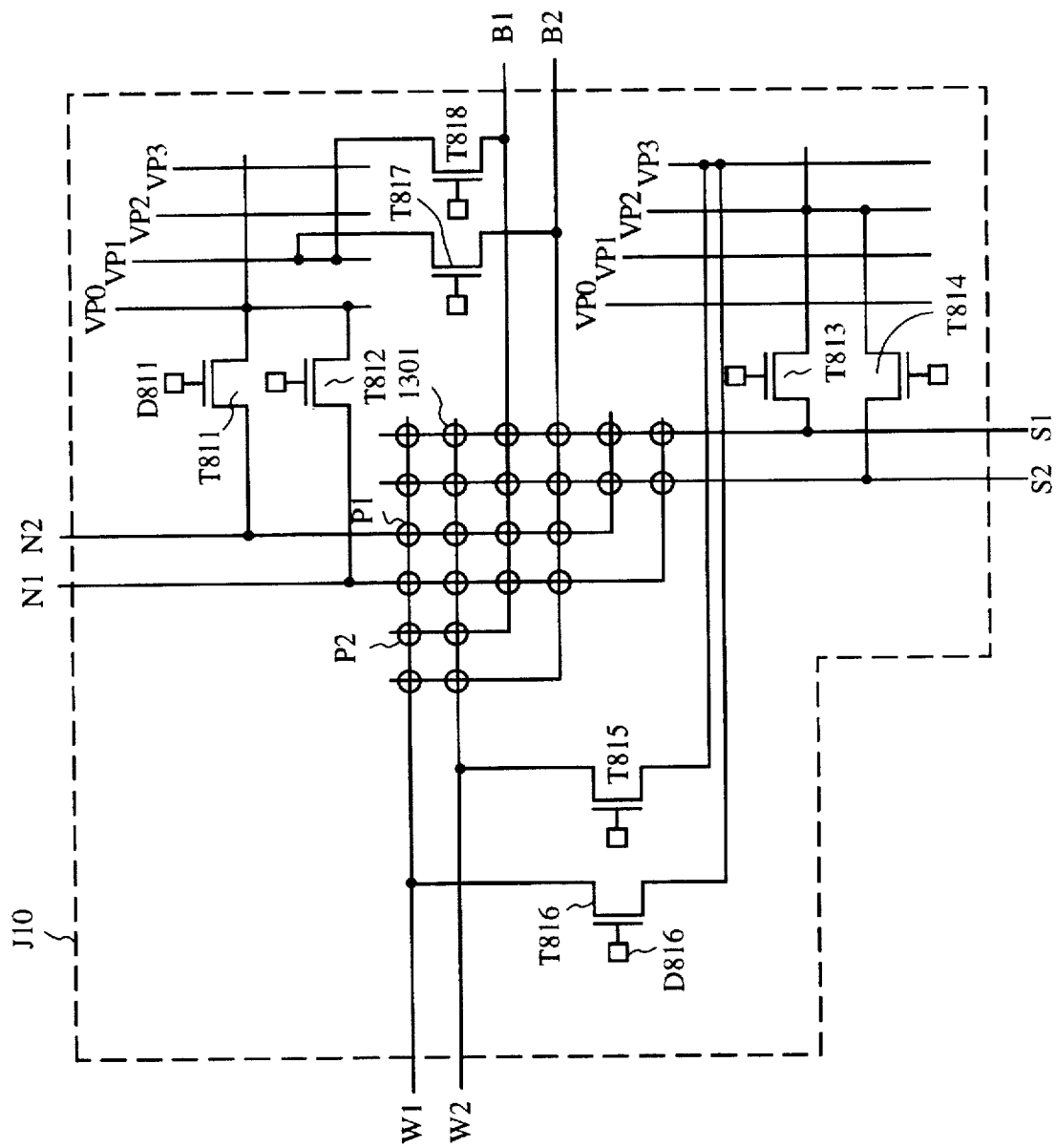

FIGS. 10A and 10B illustrate programable logic arrays which include a plurality of antifuses according to the present invention.

Figure 1A:
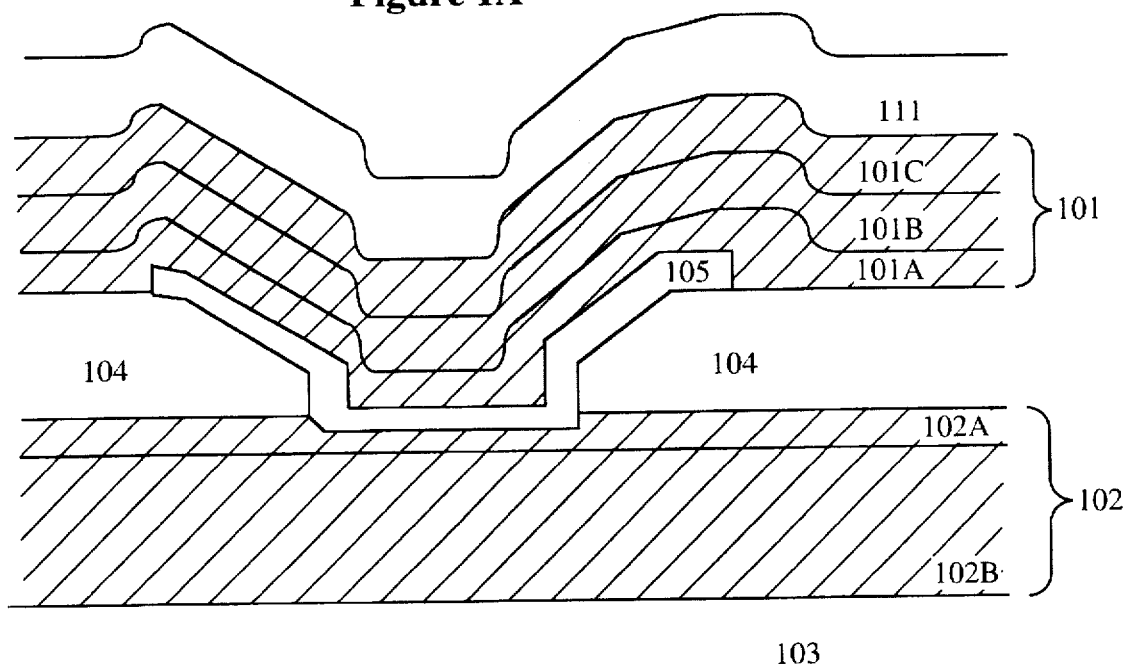
FIG. 1A illustrates a cross-sectional view of an antifuse structure having a standard topography.

FIGS. 11A–H illustrate the fabrication of an antifuse as illustrated in FIGS. 1A in which the antifuse layer is as illustrated in FIG. 2.

Figure 11A:
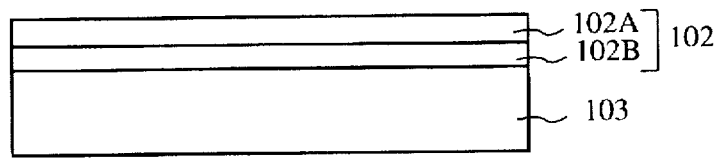

FIG. 11A illustrates the formation of a conductive layer over the substrate.

Figure 11B:
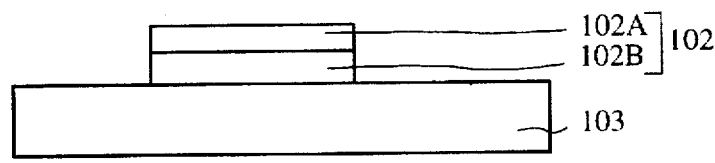

FIG. 11B illustrates the photolithography of the conductive layer.

Figure 11C:
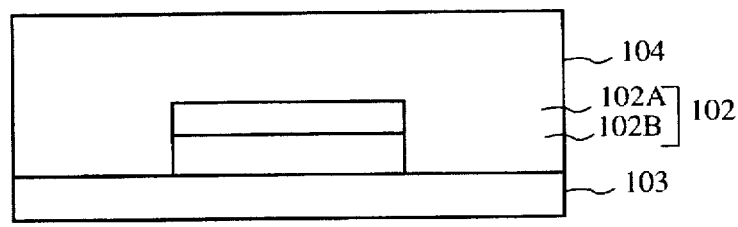

FIG. 11C illustrates the formation of a dielectric layer over the conductive layer.

Figure 11D:
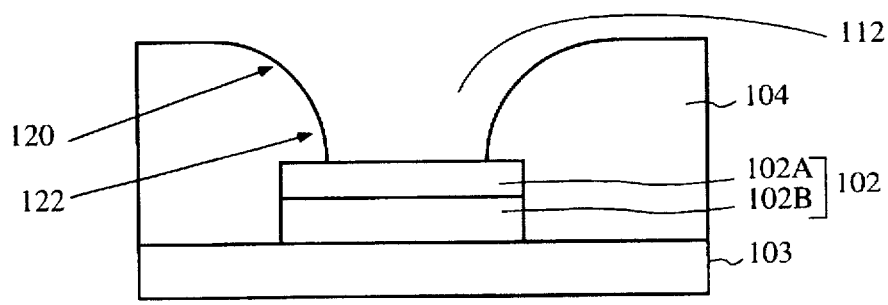

FIG. 11D illustrates the formation of a via through the dielectric layer.

Figure 11E:
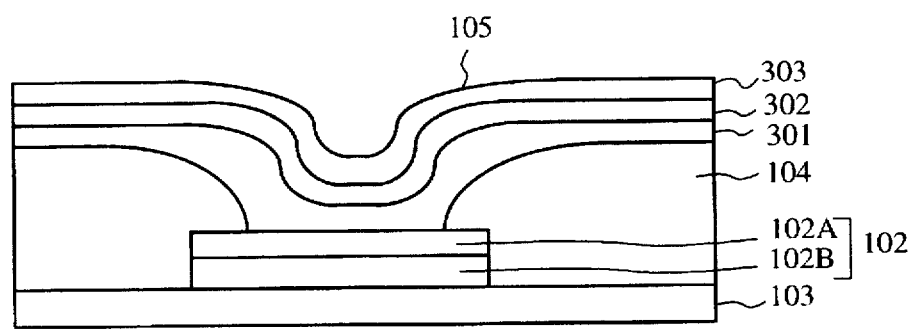

FIG. 11E illustrates the formation of an antifuse layer over the conductive layer.

Figure 11F:
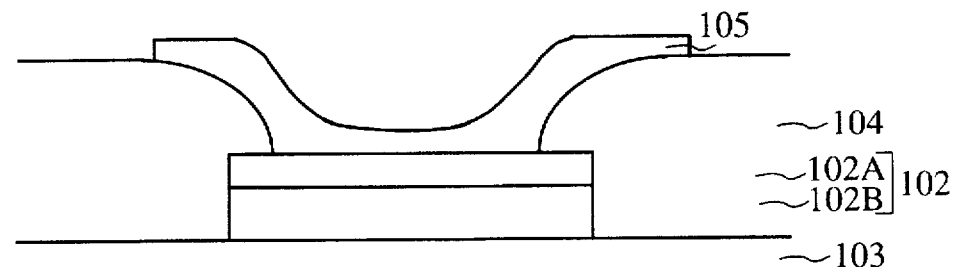

FIG. 11F illustrates the photolithography of the antifuse layer to define the antifuse.

Figure 11G:
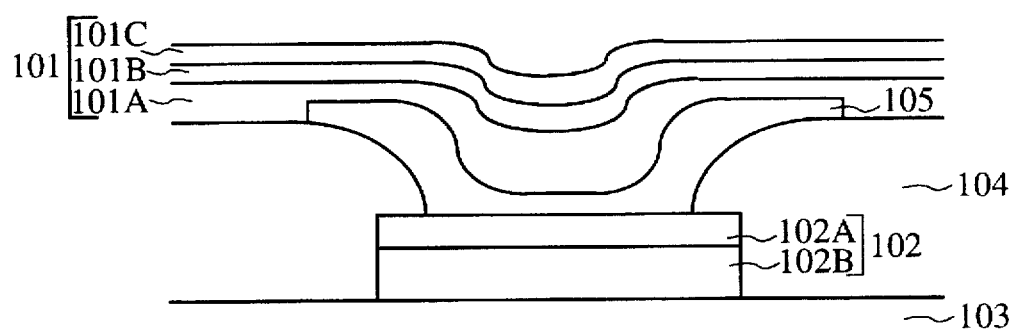

FIG. 11G illustrates the formation of a conductive layer over the antifuse layer.

Figure 11H:
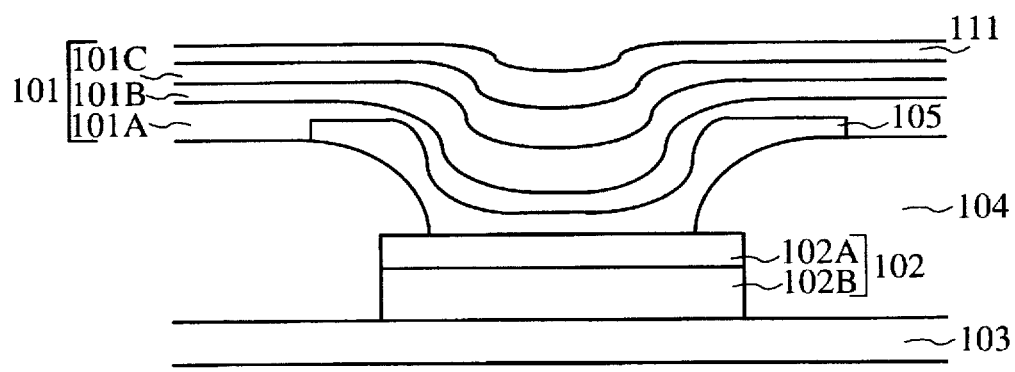

FIG. 11H illustrates the formation of a protective layer over the conductive layer.

DETAILED DESCRIPTION

The present invention relates to amorphous silicon (a-Si) antifuses for use in a programmable interconnect structure for interconnecting logic blocks in a programmable logic device. The antifuses of the present invention may be used in any programmable logic device in which antifuses are commonly used. Examples of such programmable logic devices include, but are not limited to field programmable gate arrays.

The present invention also relates to a programmable interconnect structure which includes a plurality of the amorphous silicon antifuses of the present invention. The present invention also relates to a programmable logic device which includes a plurality of logic blocks interconnected by a programmable interconnect structure which includes a plurality of the amorphous silicon antifuses of the present invention.

The amorphous silicon antifuses of the present invention include two conductive layers and an antifuse layer positioned between the two conductive layers. The antifuse layer is formed of at least one amorphous silicon layer and at least one oxide layer. In one embodiment, the oxide layer is grown from the amorphous silicon layer. By using an oxide layer positioned between two amorphous silicon layer, a thinner antifuse layer can be used in the a-Si antifuse of the present invention than if only a layer of amorphous silicon were used while still providing desirable performance characteristics. In particular, the antifuses of the present invention provide an enhanced programing voltage distribution, reduced low voltage failure and low leakage current. In addition, by growing the oxide layer from the amorphous silicon layer, an oxide layer having a higher quality is formed than if the oxide layer were formed through an oxide deposition process.

FIGS. 1A–1E illustrate cross-sections of a-Si antifuses according to the present invention, which have different topographies. The antifuse illustrated in FIG. 1A has a standard topology, i.e., where the antifuse is positioned on a level platform. The antifuse illustrated in FIG. 1B has a tilt topology, i.e., where the antifuse is positioned on a tilted platform. The antifuse illustrated in FIG. 1C has a trench topography. The antifuse illustrated in FIG. 1D has a notch topography and the antifuse illustrated in FIG. 1E has a high portion topography. One advantage of the antifuse structures of the present invention is that its design is conducive for being formed over a variety of underlying structure topologies, thereby greatly enhancing the range of devices into which the antifuses may be incorporated.

Figure 1B:
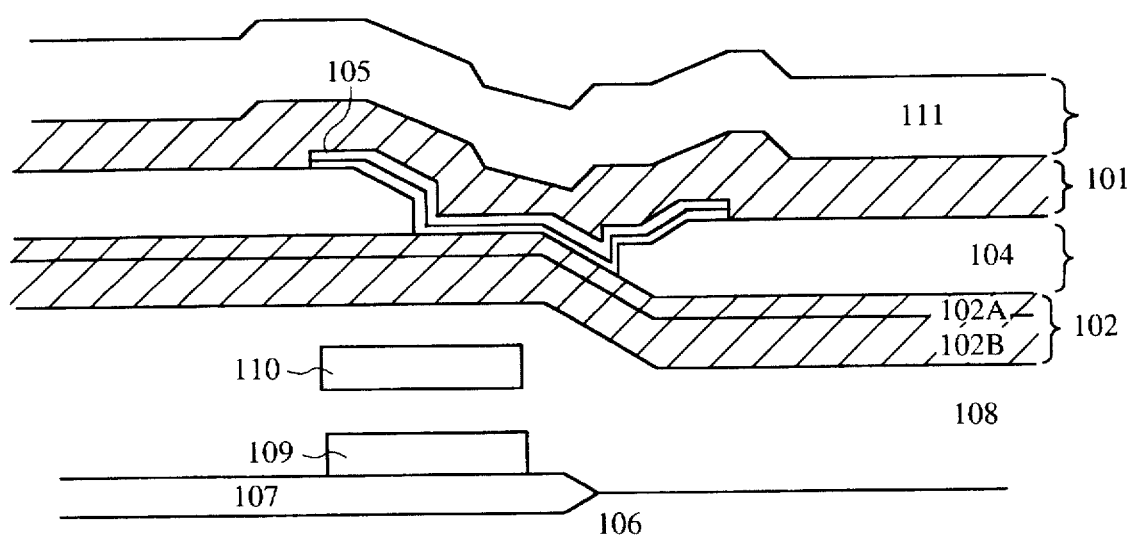
FIG. 1B illustrates a cross-sectional view of an antifuse structure having a tilt topography.
Figure 1C:
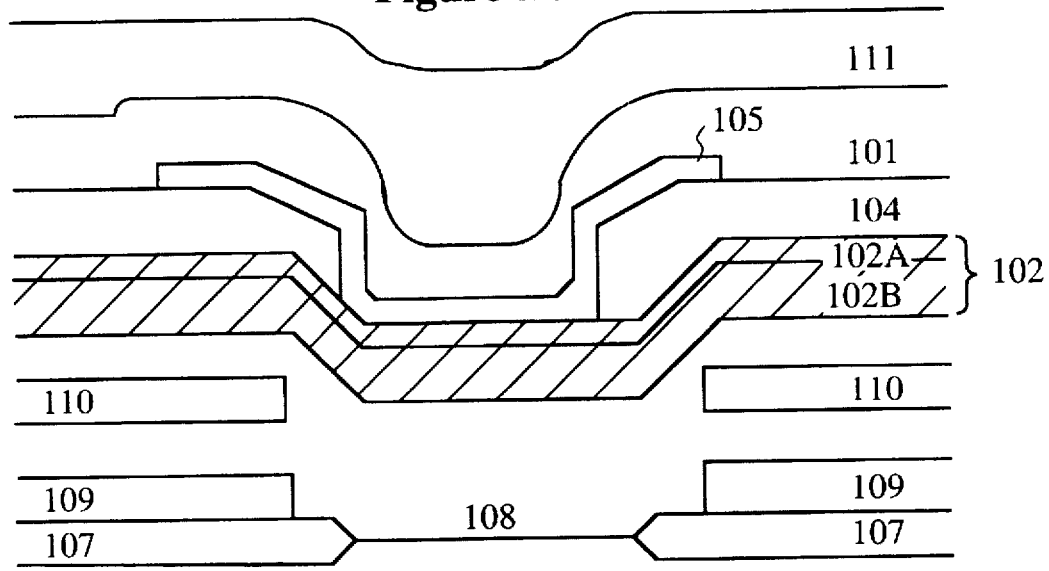
FIG. 1C illustrates a cross-sectional view of an antifuse structure having a trench topography.
Figure 1D:
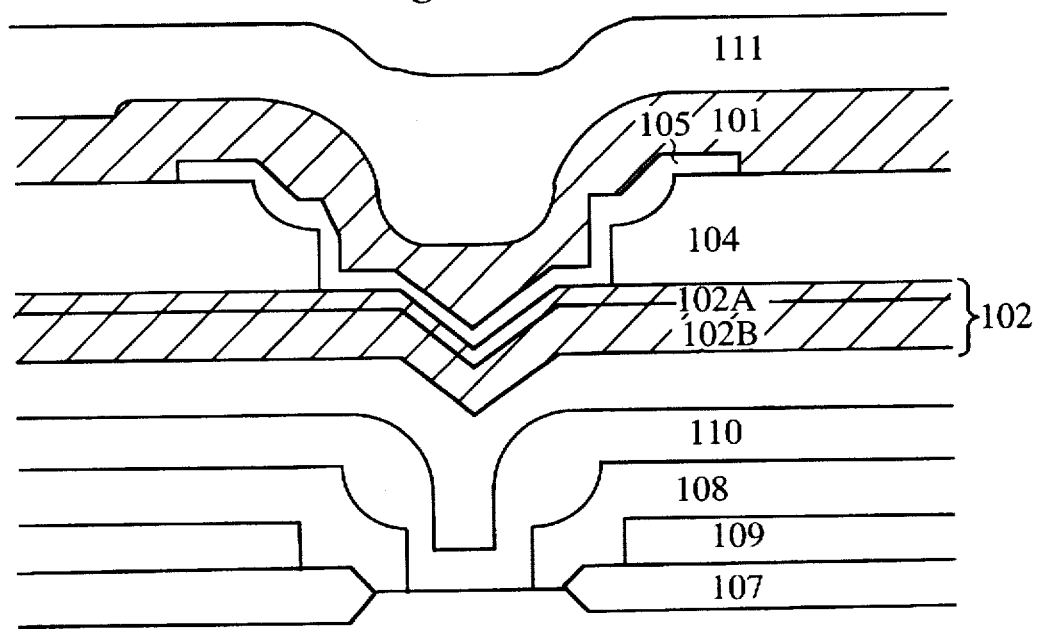
FIG. 1D illustrates a cross-sectional view of an antifuse structure having a notch topography.
Figure 1E:
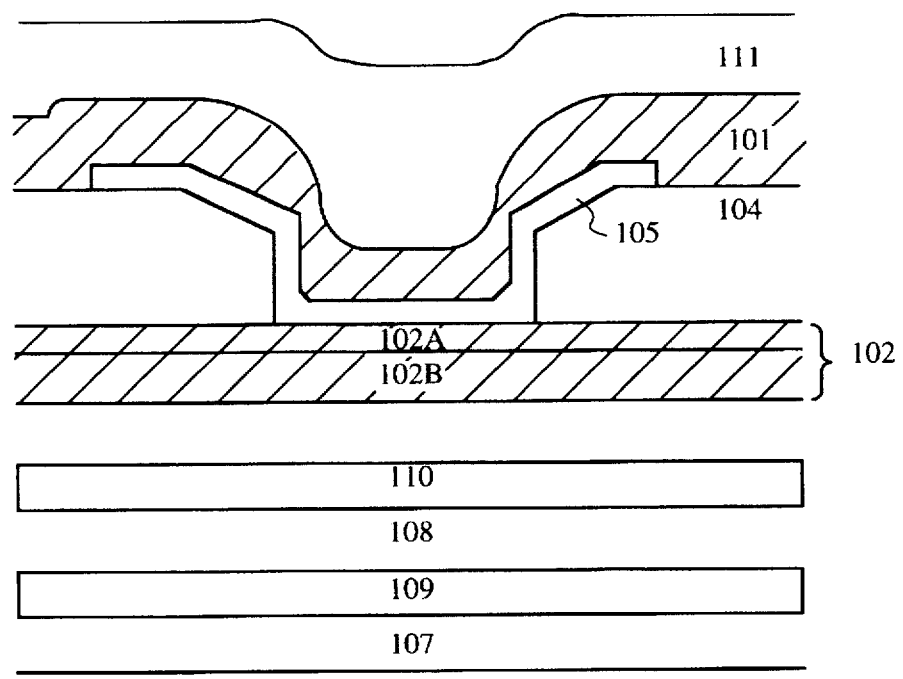
FIG. 1E illustrates a cross-sectional view of an antifuse structure having a high portion topography.

The different components of the antifuses illustrated in FIGS. 1A–1E are described herein with regard to FIGS. 1A and 1B. FIGS. 1C–1E are labelled consistently with FIGS. 1A and 1B.

The antifuse illustrated in FIG. 1A includes a substrate layer 103 such as a layer of silicon dioxide. Conductive layers 101 and 102 are positioned over the substrate layer 103. Positioned between the conductive layers 101 and 102 is an intermediate insulator layer 104, typically made of silicon dioxide, and an antifuse layer 105. An insulator 111 to serve as a protective layer, such as silicon dioxide or silicon nitride, is positioned over conductive layer 101.

As shown in FIG. 1A, the antifuse layer 105 is in contact with both conductive layers 101 and 102. As a result, when the antifuse layer 105 is programmed (changed to a low impedance conductive state by the application of a sufficient voltage across the layer), the two conductive layers become in electrical contact with each other.

The conductive layers 101 and 102 may be formed of a wide variety of conductive materials, including but not limited to aluminum, copper, refractory metals such as tungsten, molybdenum, platinum, titanium including titanium-tungsten (Ti—W) and titanium nitride (Ti—N), tantalum, silicides of those metals, and arsenic-doped poly-silicon. In one embodiment shown in FIG. 1A, conductive layer 101 is formed of a titanium (Ti) layer 101A, a titanium-tungsten (TiW) layer 101B and an aluminum-copper layer (AlCu) 101C. Conductive layer 102 is formed of a titanium-tungsten (TiW) layer 102A and an aluminum-copper layer (AlCu) 102B. In one embodiment, conductive layers 101 and 102 each have a thickness of between about 100–200 nm.

The antifuse structure illustrated in FIG. 1B includes a silicon substrate 106 on which is positioned insulator layers 107 and 108. In one embodiment, insulator layers 107 and 108 are each made of silicon dioxide. Interconnect layer 109, which is typically formed of polysilicon, MoSi, or WSi, is positioned on insulator layer 107. Positioned within insulator layer 108 is another interconnect layer 110 which typically includes aluminum, copper, titanium, titanium-tungsten and/or titanium nitride.

Conductive layer 102, antifuse layer 105 and conductive layer 101 are positioned on insulator layer 108. Insulator 111, which serves as a protective layer, such as silicon dioxide or silicon nitride, is positioned over conductive layer 101.

Figure 1F:
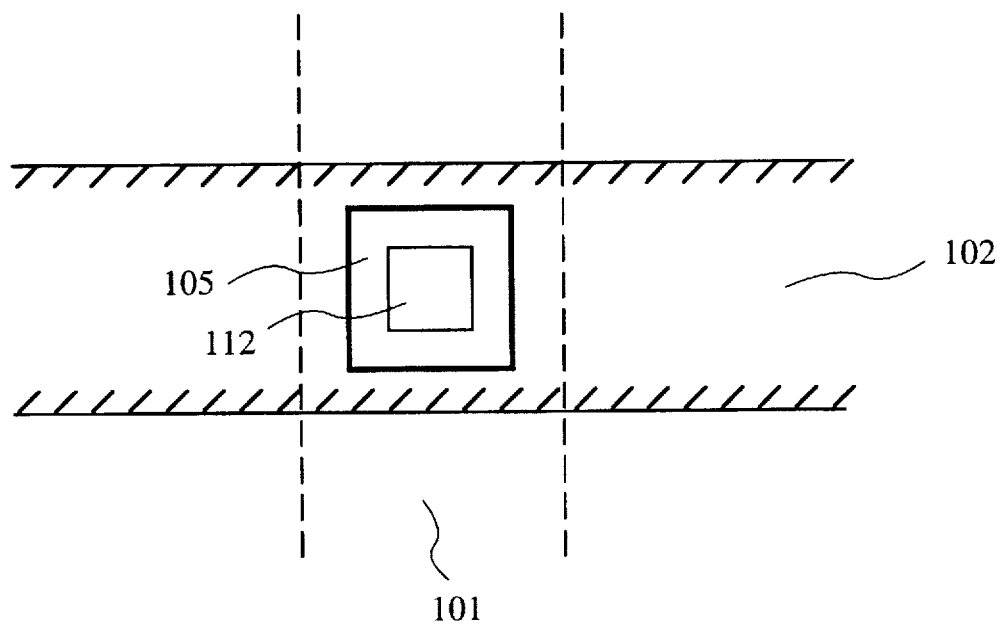
FIG. 1F illustrates a top view of the antifuse structure illustrated in FIG. 1A.
Figure 1G:
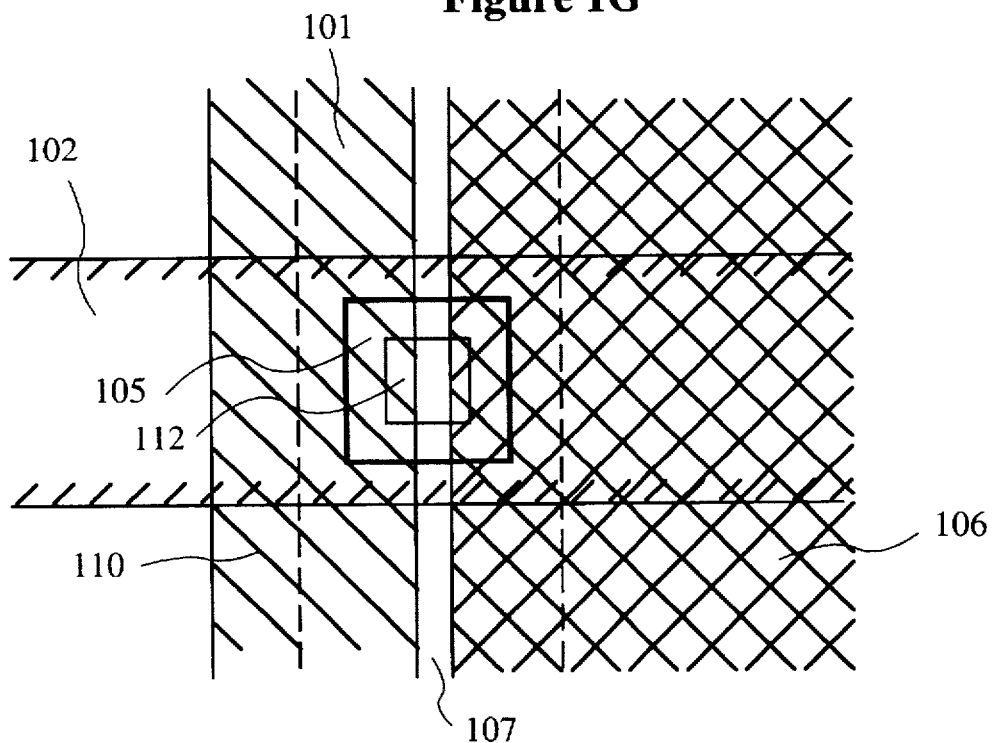
FIG. 1G illustrates a top view of the antifuse structure illustrated in FIG. 1B.

FIG. 1F and 1G illustrate top-down views of the a-Si antifuse structures illustrated in FIGS. 1A and 1B respectively. As shown in FIGS. 1F and 1G, antifuse layer 105 is completely sandwiched between conductive layers 101 and 102. A via opening 112 is also shown through insulator layer 104 (not shown).

While FIGS. 1A–1B illustrate different antifuse structure embodiments, it should be understood that the present invention is not intended to be limited to the specific antifuse structures illustrated. Rather, the invention is intended to encompass any antifuse structure which includes an antifuse layer having at least one amorphous silicon layer and at least one oxide layer as specified herein.

FIGS. 2–3 illustrate alternative embodiments for the antifuse layer 105 employed in antifuse structures according to the present invention. As illustrated in FIG. 2, the antifuse layer 105 includes an oxide layer 202 positioned between two amorphous silicon layers 201 and 203.

FIG. 3 illustrates another alternate embodiment in which antifuse layer 105 includes a plurality of amorphous silicon layers (301, 303, 305) and a plurality of oxide layers (302, 304) positioned between the amorphous silicon layers (301, 303, 305).

Through the use of at least one oxide layer positioned between two amorphous silicon layers, as illustrated in FIGS. 2–3, a thinner antifuse layer can be used than if a single amorphous silicon layer is used as the antifuse layer. In one embodiment, the combined thicknesses of the amorphous silicon layer(s) and oxide layer(s) are less than about 100 nm. In another embodiment, the combined thicknesses are between about 20 and 85 nm. In yet another embodiment, the combined thicknesses are between about 50 and 85 nm.

In one embodiment, the oxide layer(s) each have a thickness of less than about 10 nm. In yet another embodiment, the oxide layer(s) each have a thickness of between about 1 and 10 nm. In general, the oxide layer(s) employed in the antifuse layer is formed of a sufficient thickness to improve the properties of the antifuse layer without altering the amorphous silicon conduction properties of the antifuse layer.

Defects and pinholes in the amorphous silicon layer of a-Si antifuses disturb the film properties and lead to low voltage failures. The use of more than one oxide layer in the antifuse layer, as illustrated in FIG. 3, enhances the sealing of defects/pinholes in the plurality of amorphous silicon layers. In addition, by using more than one oxide layer, a higher net concentration of oxide can be used without changing the nature of the antifuse from an amorphous silicon type antifuse to a dielectric type antifuse.

The oxide layer used in antifuses of the present invention has a propensity to oxidize with the conductive layer when placed in direct contact with the conductive layer. The oxide layer is particularly reactive toward conductive layers which includes titanium. As illustrated in FIGS. 2 and 3, at least one oxide layer is positioned between two amorphous silicon layers in order to prevent the oxide layer from reacting with the conductive layer, thereby preserving the integrity of at least one of the oxide layers. When multiple amorphous silicon and oxide layers are used, the significance of any one oxide layer reacting with one of the conductive layers is reduced as long as at least one oxide layer is present which is positioned between two amorphous silicon layers.

While FIGS. 2 and 3 illustrate two different embodiments for the antifuse layer, it should be understood that the present invention is intended to encompass the use of any combination of one or more oxide layers positioned between two or more amorphous silicon layers in an antifuse. For example, there is no limit to the number of amorphous silicon and oxide layers that may be used in the antifuse layer. Further, it is envisioned that additional layers of other materials may be interposed within the antifuse layer. It should also be understood that the present invention is intended to encompass antifuses where an oxide layer is positioned adjacent to one or both of the conductive layers.

FIG. 4 illustrates the programing voltage characteristics of an antifuse having a single amorphous silicon layer whereas FIG. 5 illustrates the programing voltage characteristics of an antifuse having an oxide layer positioned between two amorphous silicon layers as illustrated in FIG. 2. Both FIGS. 4 and 5 show the programing characteristics of antifuse structures having trench, notch, tilt, and high portions topographies as illustrated in FIGS. 1B–E.

The x axes shown in FIGS. 4 and 5 represent the voltage needed to program the antifuse. The y axes shown in FIGS. 4 and 5 represent to the cumulative percentage of antifuses tested which are programmed at a voltage at or below a particular programming voltage.

The trench, notch and tilt data points appearing in FIG. 4 at 5.5V (bottom left corner) correspond to antifuses which were programmed at a significantly lower voltage than the remainder of the antifuses tested having the same design. The antifuses programmed at 5.5 V correspond to antifuse failures, most probably due to the presence of a defect in the antifuse layer. By contrast to the data presented in FIG. 4, FIG. 5 shows that none of the antifuses tested were programmed below 9 volts. The absence of any antifuses being programmed below 9 volts indicates that antifuses which employ an oxide layer positioned between two amorphous silicon layers have a lower failure rate than antifuses which employ a single oxide layer and a single amorphous silicon layer. This lower frequency of failure is believed to be due to the mismatching of defects/pinholes in the multiple amorphous silicon layers and the action of the oxide layer to seal the defects in the layers. Thus, the use of more than one amorphous silicon layer, such as in the embodiments illustrated in FIGS. 2 and 3, improves the reliability and performance of the antifuse.

The lower frequency of failures in antifuses having multiple amorphous silicon layers is very important to the commercial production of devices containing antifuses. FIG. 6 illustrates a hypothetical distribution of voltages at which antifuses in a set of devices are programmed. The voltage distribution is divided into three voltage regions A, B and C. Devices containing antifuses which are programmed in Voltage Region A correspond to factory rejects, i.e., devices identified by the factory as containing antifuses which are programmed at voltages below the highest operating voltage for which the device is rated. Devices which only contain antifuses which are programmed within Voltage Region B correspond to functioning devices. Devices containing antifuses which are programmed within Voltage Region C correspond to field rejects, i.e., devices which contain antifuses which do not program at the programming voltage used by the device.

Before reaching the consumer, devices are generally tested at the factory to determine whether any of the antifuses program at a voltage below the highest operating voltage for which the devices are rated. In a non-defective device, no antifuses will program. If any antifuses become programmed, the device is discarded as a factory reject. Those devices containing antifuses which become programmed below the maximum operating voltage are illustrated in Voltage Region A (the shaded region labeled FACTORY REJECT). These devices will not be sold to customers, and represent lost profits to the manufacturer. The smaller failure rate of antifuses having an oxide layer between two amorphous silicon layers, as illustrated in FIG. 6, is important commercially in that it reduces the number of devices produced which fall into the FACTORY REJECT category. As a result, the production yield of devices containing antifuses having multiple amorphous silicon layers is enhanced.

The use of multiple amorphous silicon layers separated by at least one oxide layer also reduces the variability in the amount of voltage required to program the antifuse. For example, the programing data illustrated in FIGS. 4 and 5 shows that antifuses having multiple amorphous silicon layers exhibit less variability in the voltage required to program these structures. The slopes ($\sigma$) of the lines shown in FIGS. 4 and 5 correspond to the standard deviation of the distribution of voltages required to program different sections of the antifuse structure. The programing voltage used by the device is typically equal to at least about the mean programing voltage plus 5 times the standard deviation of the programming voltage distribution to insure that all of the antifuses are programmed.

As can be seen by comparing FIGS. 4 and 5, the $\sigma$ of distribution of the voltages required to program antifuses having multiple amorphous silicon layers is significantly smaller than the $\sigma$ of distribution of the voltages required to program antifuses having a single amorphous silicon layer. Based on the test results illustrated in FIG. 4 for an antifuse having a single amorphous silicon layer and a single oxide layer, a programing voltage of at least about 12.68V (10V+ 5* $\sigma$) ($\sigma$=0.537)) (wherein the programing voltage range will be the target programing voltage (10V) $\pm$ a certain number (n) of $\sigma$ (n is determined by the size of the population, such that n, in one wafer embodiment, is 5)) must be used to insure that virtually all of the antifuses are programed. By contrast, the test results illustrated in FIG. 5 for an antifuse having an oxide layer positioned between two amorphous silicon layers indicate that a programming voltage of at least about 11.28 V (10V+5*$\sigma$) ($\sigma$=0.257)) must be used in order to insure that virtually all of the antifuses are programmed. The 1.4 volt difference between the minimum programming voltage needed to program virtually all of the antifuses in a programmable logic device containing these two different antifuse structures is functionally significant to the production of programmable logic devices. Since the programing voltage used by a device must be sufficiently large to insure that virtually any antifuse in the device is programmed, it is important in the construction of programmable logic devices that the antifuses have a small distribution with regard to the voltages needed to program each of the antifuses.

The construction of antifuses having a small distribution of programing voltages is also important with regard to preventing the unwanted programming of any of the antifuses during the normal operation of the device. The programing voltage used must be sufficiently larger than the operating voltage such that none of the antifuses are programmed during normal operation. Based on the data presented in FIGS. 4 and 5, some antifuses will be programmed by voltages as low as 7.32V (10V −*5$\sigma$) and 8.72V (10V −*5$\sigma$), respectively. Thus, by reducing the size of the programming voltage distribution of the antifuses, lower programing voltages can be used with the same operating voltage.

Therefore, as shown by the embodiments illustrated in FIGS. 4 and 5, by halving σ (i.e. 0.537 to 0.257), the programing voltage range is also halved. Thus, the present invention dramatically improves (i.e. narrows) the programing voltage range.

One of the advantages provided by the use of at least one oxide layer positioned between two amorphous silicon layers in the amorphous silicon antifuses of the present invention is that the antifuses produced have a narrower distribution of programing voltages. Thus, when a plurality of antifuses according to the present invention are incorporated into a programable logic device, the standard deviation of the voltage required to program the plurality of antifuses can be reduced to less than about 0.30. In some embodiments, the standard deviation is reduced to less than about 0.25, and in other embodiments less than about 0.20.

The programing voltage of the antifuses of the present invention are typically between about 5 and 15 V. Higher breakdown voltages may be used and are generally limited by the size of the drivers that are used. Lower programing voltages than 5 V may also be used and are generally limited by the operating voltage that is used since the programing voltage must be sufficiently greater than the operating voltage to prevent antifuse programming during normal device operation.

The programing voltage of an antifuse can be controlled by controlling the thickness of the antifuse layer, by varying the nitrogen concentration of the amorphous silicon layer and by doping the amorphous silicon layer. The antifuses of the present invention provide the advantage that a thinner antifuse layer can be used as a result of incorporating at least one oxide layer into the antifuse layer.

Several methodologies are known in the art for forming the amorphous silicon layer. It is well known in the art that different programing voltages can be achieved by varying the composition and thickness of the amorphous silicon layer. As described above, the antifuse typically has a programing voltage of between about 5 and 15 Volts.

In one embodiment, the amorphous silicon layer ($Si_xH_yN_z$) used in the antifuse is formed in mole percentages of between about 8–12% H and between about 10–25% N. In another embodiment, the amorphous silicon layer includes about 20% N.

In one embodiment, the oxide layer used in the antifuse layer 105 is grown from the amorphous silicon layer. Several methodologies are also known in the art for growing an oxide layer over an amorphous silicon layer, all of which may be used in the present invention. Methods for growing the oxide layer include forming the oxide through the use of a high dose Ar+ implant, and through oxygen plasma treatments.

In one embodiment, the oxide layer is grown in a manner that is self-limiting (also known in the field as parabolic) so that the thickness of the oxide layer formed can be carefully controlled. Oxide layers produced in self-limiting oxide films are generally denser and contain fewer defects, such as pinholes.

The present invention also relates to a programable interconnect structure which includes a plurality of the amorphous silicon antifuses of the present invention. The present invention also relates to a programable logic device which includes a plurality of logic blocks interconnected by a programmable interconnect structure which includes a plurality of the amorphous silicon antifuses of the present invention. The programmable logic device may be any programmable logic device in which antifuses are commonly used. Examples of such programmable logic devices include, but are not limited to field programable gate arrays. The incorporation of antifuses into an interconnect structure for a programmable logic device is described herein with regard to FIGS. 7–10.

In FIG. 7, horizontal row lines R1 through Rn are connected to vertical column lines C1 through Cm through interconnects wherein each interconnect includes a diode 1001 and an antifuse 1002 according to the present invention. Each diode and antifuse illustrated in FIG. 7 is identified by the row and column which it connects. Thus, the diode 1001 and antifuse 1002 which connects row R2 to column C1 are diode R2,C1 and antifuse R2,C1. To program the interconnect structure 1000 so that row R2 is connected to column C1, all columns except column C1 are brought to a high voltage and all rows except row R2 are brought to a low voltage. Row R2 is brought to a high voltage and column C1 is brought to a low voltage. This combination of voltages causes the diodes 1001 at the intersections not including row R1 or Column C1 to be back biased. There is no voltage drop at intersections of column C1 with rows other than row R2 and there is no voltage difference at intersections of row R2 with columns other than column C1. However, diode R2,C1 is forward biased so that the full voltage difference is experienced by antifuse R2,C1. If the voltage levels are sufficient to program the particular antifuse, antifuse R2,C1 will short out and form a permanent connection between row R2 and column C1 through diode R2,C1. This technique works well for memory arrays. Note that the diodes 1001 prevent two-way flow of current and thus may be inappropriate for certain programmable logic applications where bidirectional current flow is required.

The need for diodes 1001 (FIG. 7) is eliminated in FIG. 8 through the use of cross point switch connections. The interconnect structure 1100 illustrated in FIG. 8 uses three voltage levels for selecting the intersection to be connected. As shown in FIG. 8, columns C1 through Cm can be connected to rows R1 through Rn by connecting antifuses 1101 at the appropriate intersections. As with FIG. 7, the antifuses 1101 are identified by the rows and columns which they connect. In order to connect column C1 to row R2, all rows and columns except column C1 and row R2 are brought to an intermediate voltage level. Column C1 is brought to a high voltage level and row R2 is brought to a low voltage level. With this combination, antifuses at intersections not including row R2 or column C1 experience no voltage difference. Antifuses 1101 connecting rows except row R2 to column C1 experience the voltage difference between the high and intermediate levels. Antifuses 1101 connecting columns except column C1 to row R2 experience the voltage difference between the intermediate and low levels. If the intermediate voltage level is half way between the high and low voltage levels, the voltage difference experienced by antifuse R2,C1 is twice that of other antifuses 1101 in row R2 or column C1. As long as the voltage difference between the high and low voltages is sufficient to short the antifuses and the voltage rise or difference between the intermediate and the high or low voltages is not sufficient to short the antifuse 1101, this technique can be used to program an array of connections without having diodes in the signal path (as provided in the interconnect structure 1000 of FIG. 7).

If row R2 is then also to be connected to column Cm, both row R2 and column C1 will be brought to a low level, other columns except for columns C1 and Cm will be brought to an intermediate level, and column Cm will be brought to a high level. Thus, to place the programing voltage on antifuse R2, Cm, half the programing voltage must be placed across all antifuses 1101 in row R2, column Cm and also column C1, except of course for antifuse R2, C1 which is already programmed.

If row Rn is to be connected to column C1, row Rn will be brought low. Column C1 will be brought high, thus placing high voltages on row R2 and column Cm which have been previously connected. However, this action places a programing voltage not only on antifuse Rn, Ci which is to be programmed but also on antifuse Rn, Cm which is not intended to be programmed.

FIG. 9 illustrates an interconnect structure 1200 in which isolation is not provided by diodes but is accomplished by dividing the entire array into smaller units for isolation. For example, if an antifuse 1201 of section 1.1 is to be programmed, the transistors in units BR1, 1 and BC1,1 are turned off thereby avoiding the possible erroneous programing which would occur if the entire array (i.e., sections 1.1; 1.2; 2.1; and 2.2) were interconnected. Similarly, other sections can be isolated for antifuse programing. For operation of the device in which the antifuse array of FIG. 9 is located, isolating transistors such as those in units BR1,1 and BC1,1 are turned on so that the array is interconnected as desired.

FIGS. 10A and 10B illustrates an interconnect structure which includes a plurality of antifuses according to the present invention. As shown in FIG. 10A, a plurality of horizontal and vertical interconnect line segments L1 through L54 are positioned in an integrated circuit device with a plurality of logic devices 9-1 through 9-6. Each interconnect line segment L1 through L54 is connected through a programing transistor to one of programing voltage lines VP0 through VP4. A suitable programing transistor is described in U.S. Pat. No. 5,367,207 which is incorporated herein by reference. For simplicity, FIG. 10A illustrates only three programing transistors, for example, programing transistor TL41. Each programing transistor has a pumped decoder associated with the programing transistor, for example, pumped decoder DL41.

Antifuses 1301 for interconnecting line segments L1 through L54 are positioned at many intersections of the line segments. Also included in the logic device illustrated in FIG. 10A are interconnection boxes J1 through J12. Within each of these interconnection boxes are antifuses of the present invention for selectively interconnecting lines which extend into the boxes.

FIG. 10B shows interconnection box J10, in which two lines enter from each of the compass directions N, S, E, and W. Antifuses 1301 allow each of these lines to be connected to any other line extending into the box except for the other line coming from the same direction. The twenty-four antifuses shown in FIG. 10B provide this flexibility.

In order to program any of the antifuses, it must be possible to provide the programing voltage across each antifuse. As shown in FIG. 10B, each line segment N1, N2, E1, E2, S1, S2, W1 and W2 has a fixed connection through a transistor to one of the lines VP0 through VP3 in the programing bus. The programing bus must contain sufficient lines that interconnect line segments feeding opposite terminals of an antifuse are always connected to different lines in the programing bus so that different voltages can be applied to the opposite terminals of each antifuse 1301. For a geometry in which lines enter a connection region from four compass points, four programing bus lines provide sufficient flexibility to always connect opposite terminals of each antifuse 1301 to different bus lines. However, if lines enter a connection region from more than four compass points, additional programing bus lines may be needed. In one embodiment, as illustrated in FIG. 10A, five lines are used in the programing bus. Additional programing lines beyond four may program interconnect lines which interconnect alternating logic devices, for example.

By allocating each of the four compass directions to a different one of the four programing lines, it is possible to provide the necessary voltage difference to each of the 24 antifuses. To program antifuse F1, segment N2 is connected to programing bus line VP0 through transistor T811 by addressing pumped decoder D811. Segment W1 is connected to programing bus line VP3 through transistor T816 by addressing pumped decoder D816. To connect segment N2 to segment W1 through antifuse F1, while transistors T811 and T816 are on, a first programming voltage is applied to programming voltage line VP0 and a second programming voltage is applied to programming voltage line VP3.

The programming voltage is typically applied in a particular direction across the antifuse (from the first conductive layer to the second conductive layer or visa versa). This directional programming is performed because the voltage required to program an antifuse in different directions can vary as a result of an asymmetrical geometry in the antifuse layer and differences in the conductive interfaces in the different directions.

Alternate configurable arrays and logic devices into which the antifuses of the present invention may be incorporated include, but are not limited to the arrays described in U.S. Pat. Nos. 4,870,302, and 4,706,216, and in "The Programable Gate Array Data Book" (c) 1994, pages 1–3 to 1–8 and 2–105 to 2–117, available from Xilinx, Inc., 2100 Logic Drive, San Jose, Calif. 95124, all of which are incorporated herein by reference.

The antifuses of the present invention, their fabrication and their use in a programable logic device are illustrated by the following examples. Further objectives and advantages other than those set forth above will become apparent from the examples and accompanying drawings.

EXAMPLE 1

Fabrication of an Antifuse

The following example provides a protocol for fabricating an antifuse having a standard topography in which the antifuse has the same amorphous silicon-oxide-amorphous silicon antifuse layer construction as is illustrated in FIG. 2.

a. Formation of Conductive Layer 102

An RF back sputter is performed to clean the substrate 103. An AlCu layer (5000 Å) 102B and a TiW layer (1700 Å) 102A are then deposited in succession at a temperature of 250° C. and at a pressure of 7 m Torr as illustrated in FIG. 11A.

Photolithography is conducted on the conductive layer 102 to define regions of conductive layer which is slightly larger than the antifuse. After masking the conductive layer, the conductive layer 102 is etched to remove an oxide layer which tends to naturally form on the TiW layer 102A. Etches are then performed to remove the TiW layer 102A and to remove the AlCu layer 102B. In general, a variety of procedures may be used to anisotropically etch these layers. In one embodiment, $BCl_3$ and $Cl_2$ is used to etch the oxide on the TiW layer 102A. $CF_4$ is used to etch the TiW layer 102A and $CHF_3+BCl_3+Cl_2$ is used to etch the AlCu layer 102B.

After the conductive layer has been etched, the exposed surface is cleaned, for example by a $CF_4$ etch followed by a $CHF_3$ etch. Any remaining photoresist is then removed by an $O_2$ plasma to yield a structure as illustrated in FIG. 11B. After removal of the photoresist, the wafer is cleaned by dip etch and wash followed by a spin dry.

b. Formation of Dielectric Layer 104

A dielectric layer 104 is formed over the conductive layer 102 in two steps. First, a portion of the dielectric layer 104 is deposited over the conductive layer 102 which is then planarized by depositing a resist layer and etching back. Any remaining resist material is removed by an $O_2$ plasma. After planarization, the dielectric layer 104 is cleaned by a dip etch and wash followed by a spin dry. A second layer of the dielectric layer 104 is then formed by chemical vapor deposition to yield a structure as illustrated in FIG. 11C.

c. Formation of Via 112

Photolithography is performed on the wafer to define the positioning of via 112, as illustrated in FIG. 11D. The via 112 may be formed in two stages. During the first stage, an upper portion of the dielectric layer 104 is etched. The etching process used in the first stage is not highly anisotropic. As a result, the first stage etch forms a gap in the dielectric layer 104 which increases in width toward the surface of the dielectric layer to define a broad upper shoulder 120 of the via. In the second stage, a lower, narrower portion 122 of via 112 is formed by a highly anisotropic etch of a lower portion of the dielectric layer. For example, the first stage etch may be a wet etch at about 25° C. using an etch solution containing about 33% $CH_3COOH$, 33% $NH_4F$ and 33% $H_2O$. The second stage anisotropic etch may be a dry etch using $O_2$ and $CHF_3$. After forming via 112, any remaining resist material is removed by an $O_2$ plasma to yield the structure as illustrated in FIG. 11D. The wafer is then cleaned by a dip etch and wash followed by a spin dry.

d. Formation of Antifuse Layer 105

The exposed surface of the conductive layer 102 is prepared for the formation of an antifuse layer 105 by first oxidizing the exposed surface of the conductive layer 102 with $O_2$. The wafer is then cleaned by a dip etch and wash followed by a spin dry.

As illustrated in FIG. 11E, an antifuse layer 105 having an amorphous silicon layer 301, an oxide layer 302 and a second amorphous silicon layer 303 may be formed as described below. In this embodiment, the antifuse layer 105 has a thickness in the range of 300–700 Å.

i. Formation of Amorphous Silicon Layer

A layer of amorphous silicon 301 is formed under vacuum in the presence of $SiH_4$ (200–300 sccm) and $N_2$ at a pressure of between 200 mTorr and 350 mTorr, an RF power of between 0.75 and 1.0 Å and at a deposition rate of 45–55 Å/min. The amorphous silicon layer 301 is formed to a thickness of between about 150 and 350 Å.

With regard to the formation of the amorphous silicon layer 301, as well as other amorphous silicon layers incorporated into an antifuse layer 105, the amorphous silicon layer can be formed in two or more steps where the wafer is rotated about its axis between the steps in order to expose different portions of the wafer surface to equivalent deposition environments, thereby increasing the thickness uniformity of the amorphous silicon layer formed.

ii. Formation of Oxide Layer 302

Oxide layer 302 is grown from the amorphous silicon layer 301 by removing the wafers from the vacuum and exposing the wafers to air for between about 1.5 and 2 hours.

iii. Formation of Amorphous Silicon Layer 303

A layer of amorphous silicon 303 is formed over the oxide layer 302 under vacuum in the presence of $SiH_4$ (200–300 sccm) and $N_2$ at a pressure of between 200 mTorr and 350 mTorr, an RF power of between 0.75 and 1.0 Å and at a deposition rate of 45–55 Å/min. The amorphous silicon layer 301 is formed to a thickness of between about 150 and 350 Å.

iv. Ar Implant

In order to improve the integrity of the antifuse layer 105, an Ar implant ($1 \times 10^{16}$ $cm^{-1}$ 35KeV) is performed on the antifuse layer 105 in order to grow a thin oxide layer on the top surface of the antifuse layer. Alternatively, atoms such as silicon, arsenic, oxygen or phosphorus may be implanted.

v. Antifuse Layer Mask

Photolithography is performed on antifuse layer 105 in order to define the positioning of the antifuses. The antifuse layer 105 is then dry etched using $CHF_3$ (75 cc/min) and $O_2$ (30 cc/min) at 40 mTorr, 1400 W followed by a second dry etch using $CHF_3$ (75 cc/min) and Ar (100 cc/min) at 120 mTorr, 400 W to form the structure as illustrated in FIG. 11F. Any remaining resist material is removed by an $O_2$ plasma. The wafer is then cleaned by a dip etch and wash followed by a spin dry.

e. Formation of Conductive Layer 101

Prior to forming conductive layer 101, a thin oxide layer is formed on the exposed surface of the antifuse layer 105 by oxidizing the antifuse layer 105 with $O_2$. The wafer is then cleaned by a dip etch and wash followed by a spin dry.

Conductive layer 101 including a layer of Ti (250 Å) 101A, a layer of TiW (1700 Å) 101B and a layer of AlCu (5000 Å) 101C is then formed over the antifuse layer 105 at 250° C. and at a pressure of 7 m Torr to form the structure as illustrated in FIG. 11G.

Photolithography is conducted to mask the conductive layer 101. After masking, the conductive layer 101 is etched using $BCl_3$ and $Cl_2$ to remove an oxide layer. A $CHF_3$+$BCl_3$+$Cl_2$ etch is performed to remove the AlCu layer 101C. A $CF_4$ etch is performed to remove the TiW layer 101B. A $CF_4$+$Cl_2$ etch is performed to remove the TiW layer 101A. The wafer is then cleaned by a $CF_4$ etch followed by a $CHF_3$ etch. Any remaining photoresist is then removed by an $O_2$ plasma. After removal of the photoresist, the wafer is cleaned by dip etch and wash followed by a spin dry.

f. Formation of Protective Layer 111

After formation of conductive layer 101, a protective layer 111 formed of 0.6 μm phosphosilica glass and 0.6 μm $Si_3N_4$ is formed over the wafer as illustrated in FIG. 11H.

While the present invention is disclosed by reference to the specific embodiments and examples detailed above, it is to be understood that these examples are intended in an illustrative rather than limiting sense, as it is contemplated that modifications will readily occur to those skilled in the art, which modifications will be within the spirit of the invention and the scope of the appended claims.

What is claimed is:

1. An antifuse comprising:
   first and second conductive layers; and
   an antifuse layer, positioned between the first and second conductive layers, having a thickness of less than about 100 nm, the antifuse layer including first and second undoped amorphous silicon layers and an oxide layer positioned between the first and second undoped amorphous silicon layers, wherein the oxide layer has a thickness of less than about 10 nm.

2. An antifuse according to claim 1 wherein the antifuse layer has a thickness of less than about 85 nm.

3. An antifuse according to claim 1 wherein the antifuse layer has a thickness of between about 20 and 85 nm.

4. An antifuse according to claim 1 wherein the oxide layer has opposing first and second surfaces, the first undoped amorphous silicon layer being in contact with the first surface and the second undoped amorphous silicon layer being in contact with the second surface.

5. An antifuse according to claim 1 wherein the oxide layer has a thickness of between about 1 and 10 nm.

6. An antifuse according to claim 1 wherein the oxide layer is grown from the amorphous silicon layer.

7. An antifuse according to claim 6 wherein the oxide layer is grown by a high dose Ar+ implant.

8. An antifuse according to claim 6 wherein the oxide layer is grown by an oxygen plasma.

9. An antifuse according to claim 6 wherein the oxide layer is formed by a self-limiting growth process.

10. An antifuse according to claim 1 wherein the amorphous silicon layer is formed in mole percentages of between about 8–12% H and between about 10–25% N.

11. An interconnect structure for interconnecting logic blocks in a programmable logic device comprising:

a plurality of antifuses, at least one antifuse including first and second conductive layers and an antifuse layer having a thickness of less than about 100 nm positioned between the first and second conductive layers, the antifuse layer including first and second undoped amorphous silicon layers and an oxide layer positioned between the first and second undoped amorphous silicon layers, wherein the oxide layer has a thickness of less than about 10 nm ; and a plurality of interconnect lines, each line connected to at least one antifuse at either the first or second conductive layer of the antifuse.

12. An interconnect structure according to claim 11 wherein the antifuse layer has a thickness of less than about 85 nm.

13. An interconnect structure according to claim 11 wherein the antifuse layer has a thickness of between about 20 and 85 nm.

14. An interconnect structure according to claim 11 wherein the oxide layer has opposing first and second surfaces, the first undoped amorphous silicon layer being in contact with the first surface and the second undoped amorphous silicon layer being in contact with the second surface.

15. An interconnect structure according to claim 11 wherein the antifuse layer includes at least two oxide layers and at least three undoped amorphous silicon layers, each of the two oxide layers being positioned between a pair of undoped amorphous silicon layers.

16. An interconnect structure according to claim 11 wherein the oxide layer has a thickness of between about 1 and 10 nm.

17. An interconnect structure according to claim 11 wherein the plurality of antifuses are programmed by a range of programing voltages, the range forming a distribution having a standard deviation of less than about 0.30.

18. An interconnect structure according to claim 17 wherein the distribution of programing voltages has a standard deviation of less than about 0.20.

19. An interconnect structure according to claim 13 wherein the oxide layer is grown from the amorphous silicon layer.

20. An interconnect structure according to claim 19 wherein the oxide layer is formed by a self-limiting growth process.

21. A programmable logic device comprising:

a plurality of logic blocks;

an interconnect structure attached to each of the logic blocks for interconnecting two or more of the plurality of logic blocks, the interconnect structure including a plurality of antifuses, at least one antifuse including first and second conductive layers and an antifuse layer having a thickness of less than about 100 nm positioned between the first and second conductive layers, the antifuse layer including first and second undoped amorphous silicon layers and an oxide layer positioned between the first and second undoped amorphous silicon layers, wherein the oxide layer has a thickness of less than about 10 nm, and a plurality of interconnect lines, each line connected to at least one antifuse at either the first or second conductive layer of the antifuse.

22. A programmable logic device according to claim 21 wherein the antifuse layer has a thickness of less than about 85 nm.

23. A programable logic device according to claim 21 wherein the antifuse layer has a thickness of between about 20 and 85 nm.

24. A programmable logic device according to claim 21 wherein the oxide layer has opposing first and second surfaces, the first undoped amorphous silicon layer being in contact with the first surface and the second undoped amorphous silicon layer being in contact with the second surface.

25. A programmable logic device according to claim 21 wherein the antifuse layer includes at least two oxide layers and at least three undoped amorphous silicon layers, each of the two oxide layers being positioned between a pair of undoped amorphous silicon layers.

26. A programable logic device according to claim 21 wherein the oxide layer has a thickness of between about 1 and 10 nm.

27. A programable logic device according to claim 21 wherein the plurality of antifuses are programmed by a range of programing voltages, the range forming a distribution having a standard deviation of less than about 0.30.

28. A programable logic device according to claim 27 wherein the distribution of programing voltages has a standard deviation of less than about 0.20.

29. A programable logic device according to claim 21 wherein the oxide layer is grown from the amorphous silicon layer.

30. A programable logic device according to claim 29 wherein the oxide layer is formed by a self-limiting growth process.

* * * * *